United States Patent
Wang et al.

(10) Patent No.: US 8,444,842 B2
(45) Date of Patent: May 21, 2013

(54) ELECTROPLATING METHODS AND CHEMISTRIES FOR DEPOSITION OF GROUP IIIA-GROUP VIA THIN FILMS

(75) Inventors: Jiaxiong Wang, Castro Valley, CA (US); Serdar Aksu, Santa Clara, CA (US); Bulent M. Basol, Manhattan Beach, CA (US)

(73) Assignee: SoloPower, Inc., San Jose, CA (US)

( * ) Notice: Subject to any disclaimer, the term of this patent is extended or adjusted under 35 U.S.C. 154(b) by 0 days.

(21) Appl. No.: 13/306,863

(22) Filed: Nov. 29, 2011

(65) Prior Publication Data

US 2012/0199490 A1   Aug. 9, 2012

Related U.S. Application Data

(63) Continuation of application No. 12/123,372, filed on May 19, 2008, now Pat. No. 8,066,865.

(51) Int. Cl.
*C25D 3/56*   (2006.01)

(52) U.S. Cl.
USPC ........................................................ 205/238

(58) Field of Classification Search
USPC ........................................................ 205/238
See application file for complete search history.

(56) References Cited

U.S. PATENT DOCUMENTS

| 3,475,292 | A | * | 10/1969 | Shoushanian | 205/242 |
| 4,199,416 | A | * | 4/1980 | Middleton et al. | 205/239 |
| 4,826,579 | A | * | 5/1989 | Westfall | 205/560 |
| 2004/0131792 | A1 | * | 7/2004 | Bhattacharya | 427/437 |

OTHER PUBLICATIONS

Donglin et al., "Co-electrodeposition and Characterization of Cu(In, Ga)Se2 Thin Films", J Mater Sci (no month, 2006), vol. 41, pp. 1875-1878.*

* cited by examiner

*Primary Examiner* — Edna Wong
(74) *Attorney, Agent, or Firm* — Pillsbury Winthrop Shaw Pittman LLP

(57) ABSTRACT

An electrochemical co-deposition method and solution to plate uniform, defect free and smooth (In,Ga)—Se films with repeatability and controllable molar ratios of (In,Ga) to Se are provided. Such layers are used in fabrication of semiconductor and electronic devices such as thin film solar cells. In one embodiment, the present invention provides an alkaline electrodeposition solution that includes an In salt, a Se acid or oxide, a tartrate salt as complexing agent for the In species, and a solvent to electrodeposit an In—Se film possessing sub-micron thickness on a conductive surface.

20 Claims, 1 Drawing Sheet

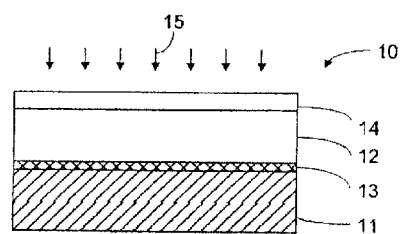
(PRIOR ART)

ELECTROPLATING METHODS AND CHEMISTRIES FOR DEPOSITION OF GROUP IIIA-GROUP VIA THIN FILMS

This application is a continuation of U.S. patent application Ser. No. 12/123,372 filed May 19, 2008, now U.S. Pat. No. 8,066,865 and is hereby incorporated by reference.

BACKGROUND

1. Field of the Invention

This invention relates to electroplating methods and solutions and, more particularly, to methods and electroplating solution chemistries for co-electrodeposition of at least one Group IIIA material and at least one Group VIA material on a conductive surface to form a Group IIIA-Group VIA compound or mixture layer with predetermined composition or stoichiometry.

2. Description of the Related Art

Solar cells are photovoltaic devices that convert sunlight directly into electrical power. The most common solar cell material is silicon, which is in the form of single or polycrystalline wafers. However, the cost of electricity generated using silicon-based solar cells is higher than the cost of electricity generated by the more traditional methods. Therefore, since the early 1970's there has been an effort to reduce the cost of solar cells for terrestrial use. One way of reducing the cost of solar cells is to develop low-cost thin film growth techniques that can deposit solar-cell-quality absorber materials on large area substrates and to fabricate these devices using high-throughput, low-cost methods.

Group IBIIIA VIA compound semiconductors comprising some of the Group IB (Cu, Ag, Au), Group IIIA (B, Al, Ga, In, Tl) and Group VIA (O, S, Se, Te, Po) materials or elements of the periodic table are excellent absorber materials for thin film solar cell structures. Especially, compounds of Cu, In, Ga, Se and S which are generally referred to as CIGS(S), or $Cu(In,Ga)(S,Se)_2$ or $CuIn_{1-x}Ga_x(S_ySe_{1-y})_k$, where $0 \leq x \leq 1$, $0 \leq y \leq 1$ and k is approximately 2, have already been employed in solar cell structures that yielded conversion efficiencies approaching 20%. Absorbers containing Group IIIA element Al and/or Group VIA element Te also showed promise. Therefore, in summary, compounds containing: i) Cu from Group IB, ii) at least one of In, Ga, and Al from Group IIIA, and iii) at least one of S, Se, and Te from Group VIA, are of great interest for solar cell applications.

The structure of a conventional Group IBIIIA VIA compound photovoltaic cell such as a $Cu(In,Ga,Al)(S,Se,Te)_2$ thin film solar cell is shown in FIG. 1. The device 10 is fabricated on a substrate 11, such as a sheet of glass, a sheet of metal, an insulating foil or web, or a conductive foil or web. The absorber film 12, which comprises a material in the family of $Cu(In,Ga,Al)(S,Se,Te)_2$ is grown over a conductive layer 13, which is previously deposited on the substrate 11 and which acts as the electrical contact to the device. Various conductive layers comprising Mo, Ta, W, Ti, and stainless steel etc. have been used in the solar cell structure of FIG. 1. If the substrate itself is a properly selected conductive material, it is possible not to use a conductive layer 13, since the substrate 11 may then be used as the ohmic contact to the device. After the absorber film 12 is grown, a transparent layer 14 such as a CdS, ZnO or CdS/ZnO stack is formed on the absorber film. Radiation 15 enters the device through the transparent layer 14. Metallic grids (not shown) may also be deposited over the transparent layer 14 to reduce the effective series resistance of the device. A variety of materials, deposited by a variety of methods, can be used to provide the various layers of the device shown in FIG. 1. It should be noted that although the chemical formula for a CIGS(S) layer is often written as $Cu(In,Ga)(S,Se)_2$, a more accurate formula for the compound is $Cu(In,Ga)(S,Se)_k$, where k is typically close to 2 but may not be exactly 2. For simplicity we will continue to use the value of k as 2. It should be further noted that the notation "Cu(X,Y)" in the chemical formula means all chemical compositions of X and Y from (X=0% and Y=100%) to (X=100% and Y=0%). For example, Cu(In,Ga) means all compositions from CuIn to CuGa. Similarly, $Cu(In,Ga)(S,Se)_2$ means the whole family of compounds with Ga/(Ga+In) molar ratio varying from 0 to 1, and Se/(Se+S) molar ratio varying from 0 to 1.

The first technique that yielded high-quality $Cu(In,Ga)Se_2$ films for solar cell fabrication was co-evaporation of Cu, In, Ga and Se onto a heated substrate in a vacuum chamber. Another technique for growing $Cu(In,Ga)(S,Se)_2$ type compound thin films for solar cell applications is a two-stage process where at least two components of the $Cu(In,Ga)(S,Se)_2$ material are first deposited onto a substrate, and then reacted with S and/or Se in a high temperature annealing process. For example, for $CuInSe_2$ growth, thin layers of Cu and In are first deposited on a substrate and then this stacked precursor layer is reacted with Se at elevated temperature. If the reaction atmosphere also contains sulfur, then a $CuIn(S,Se)_2$ layer can be grown. Addition of Ga in the precursor layer, i.e. use of a Cu/In/Ga stacked film precursor, allows the growth of a $Cu(In,Ga)(S,Se)_2$ absorber.

Sputtering and evaporation techniques have been used in prior art approaches to deposit the layers containing the Group IB and Group IIIA components of the precursor stacks. In the case of $CuInSe_2$ growth, for example, Cu and In layers were sequentially sputter-deposited on a substrate and then the stacked film was heated in the presence of gas containing Se at elevated temperature for times typically longer than about 30 minutes, as described in U.S. Pat. No. 4,798,660. More recently U.S. Pat. No. 6,048,442 disclosed a method comprising sputter-depositing a stacked precursor film comprising a Cu—Ga alloy layer and an In layer to form a Cu—Ga/In stack on a metallic back electrode layer and then reacting this precursor stack film with one of Se and S to form the absorber layer. Such techniques may yield good quality absorber layers and efficient solar cells, however, they suffer from the high cost of capital equipment, and relatively slow rate of production.

One prior art method described in U.S. Pat. No. 4,581,108 utilizes a low cost electrodeposition approach for metallic precursor preparation. In this method a Cu layer is first electrodeposited on a substrate. This is then followed by electrodeposition of an In layer and heating of the deposited Cu/In stack in a reactive atmosphere containing Se. While substantially pure metallic stacks may be used as precursors to form CIGS type solar cell absorbers, it is also possible to alloy Se and/or S with In to form precursor stacks containing In containing compound phases such as InSe, InS, $In_2Se_3$ and $In_2S_3$. Similarly, Ga-selenide or sulfide layers may also be included in the precursor stacks. By including compound phases such as (In,Ga)—(S,Se) into the precursor stacks the reaction kinetics and thus the morphology and micro-structure of the resulting CIGS layers may be affected. It should be noted that (In,Ga)—(S,Se) film means a layer with a composition of $In_xGa_yS_zSe_m$, where x, y, z and m can take any value with the conditions that if x is 0, y cannot be 0 and vice versa, and if z is zero m cannot be zero and vice versa.

In—Se mixture or alloy layers have previously been deposited using electroplating techniques. Hirano, for example, electrodeposited In layers out of acidic solutions that contained a suspension of fine Se particles (U.S. Pat. No. 5,489, 372). As described by Hirano, this method yielded an electrodeposited In layer which contained dispersed selenium particles since during electrodeposition of In the Se particles near the surface of the cathode got trapped in the growing layer. As can be appreciated, this method forms a composite layer comprising electroplated In and mechanically trapped Se particles. Selenium deposition does not involve any electrochemical reduction reaction on the cathode surface, and thus the technique is not expected to be very repeatable for electronic device fabrication applications.

Electrochemical co-deposition of In and Se on a cathode surface has also been demonstrated in some prior art work. For example, Igasaki et al. (J. Crystal Growth, 1996, vol. 158, p. 268) electroplated In—Se material out of an electrolyte containing hydrochloric acid which was used to adjust the pH value of the solution to a range of 1.0-1.7. Massaccesi et al., on the other hand, used another acidic solution based on sulfuric acid (J. Electroanal. Chem., 1996, vol. 412, p. 95). This solution had a pH value of 3.45. Fernandez et al. (*WREC* 1996, p. 396) electroplated In—Se layers using acidic baths comprising In ions and $H_2SeO_3$. Kampmann et al. (Progress in PV, 1999, vol. 7, p. 129; and, Thin Solid Films, 2000, vol. 361, p. 309) reported $In_2Se_3$ film electrodeposition out of an acidic electrolyte with a pH value of 2.4. Fernandez et al. (Advanced Materials for Optics and Electronics, 1998, vol. 8, p. 1; and, Solar Energy Materials and Solar Cells, 1998, vol. 52, p. 423) and Hermann et al. (Solar Energy Materials and Solar Cells, 1998, vol. 52, p. 355) employed an $In_2Se_3$ plating electrolyte with a pH of 1.5. All of the above listed electrochemical co-deposition approaches utilize simple acidic electrolytes with pH values less than 7 and they aim to obtain In—Se alloy layers through the cathodic reaction (1) given below.

$$x\mathrm{Se(IV)} + y\mathrm{In(III)} + (4x+3y)e^- \rightarrow \mathrm{In}_y\mathrm{Se}_x \qquad (1)$$

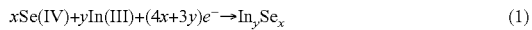

The above mentioned prior art acidic plating baths do not yield stable and repeatable electrodeposition process and high quality films that can be used in electronic device applications. Therefore, the present invention aims to develop an efficient electroplating bath to deposit smooth and defect-free Group IIIA-Group VIA alloy or mixture films in repeatable manner, where the Group IIIA material is at least one of In and Ga and the Group VIA material is at least one of Se, Te and S.

SUMMARY OF THE INVENTION

In certain embodiments, the present invention provides an electrodeposition solution for deposition of a Group IIIA-Group VIA thin film on a conductive surface, wherein the electrodeposition solution comprises a solvent, a Group IIIA material source that provides a Group IIIA material, a Group VIA material source that dissolves in the solvent and provides a Group VIA material, and a complexing agent that forms a complex ion of the Group IIIA material wherein such complex ion dissolves in the solvent; and wherein the pH of the electrodeposition solution is alkaline.

In certain embodiments, the present invention provides a method of electrodepositing a Group IIIA-Group VIA thin film on a conductive surface comprising the steps of: (a) providing an electrodeposition solution that comprises a solvent, a Group IIIA material source to provide Group IIIA material species, a Group VIA material source to provide Group VIA material species, and complexing agent that complexes with the Group IIIA material species to form soluble complex ions of Group IIIA material species: (b) adjusting the pH of the electrodeposition solution to at least 7; (c) contacting the solution with an anode and the conductive surface; (d) establishing a potential difference between the anode and the conductive surface; and (e) electrodepositing the Group IIIA-Group VIA thin film on the conductive surface.

BRIEF DESCRIPTION OF THE DRAWINGS

FIG. 1 is a schematic view of a prior art solar cell structure.

DETAILED DESCRIPTION OF THE INVENTION

The present invention in certain embodiments provides methods and electroplating baths or electrolytes to co-electrodeposit (also called electrodeposit or electroplate or plate from now on) uniform, smooth and repeatable "Group IIIA-Group VIA" alloy or mixture films where, preferably, the Group IIIA material is at least one of In and Ga and the Group VIA material is at least one of Se, Te and S. The stoichiometry or composition of such films, i.e., Group IIIA/Group VIA atomic ratio, may be controlled by varying the appropriate plating conditions of the present invention. Through the use of present invention it is possible to form micron or sub-micron thick alloy or mixture films on conductive surfaces such as Cu, In and Ga in a repeatable manner from non-acidic solutions.

Precursor stacks thus formed may be used in the fabrication of Group IBIIIA VIA semiconductor layers, which in turn may be employed as light absorber layers for radiation detectors and photovoltaic cells. The invention will now be described using In—Se film electrodeposition as an example.

In an embodiment of the present invention a method and electrolyte chemistry is provided to co-electroplate In and Se onto a conductive surface to form In—Se films with controllable In/Se molar ratio and good repeatability. The electrolyte has a pH range of neutral to basic that is well suited for large scale manufacturing. The typical conductive surface used in this invention includes surfaces comprising at least one of Cu, Ga, In, Mo, Ru, Ir, Os, etc.

The electroplating bath of the present invention comprises a complexing agent that has the ability to complex with the Group IIIA species to keep them from precipitating in the non-acidic electrolyte which has a pH value of larger than or equal to 7. Preferably, the Group VIA species of the electroplating bath is not present in the form of a complex and substantially does not form a complex with the complexing agent. As is commonly known in the art of electrodeposition or electroless deposition, complexing agents are soluble species that combine with metal ions in solution to form soluble complexes or complex ions. It should be noted that the acidic solutions of the prior art techniques may not have used such complexing agents since Group IIIA species typically remain in solution at acidic pH values. Although various complexing agents such as tartratic acid, citric acid, acetic acid, malonic acid, malic acid, succinic acid, ethylenediamine (EN), ethylenediaminetetra acetic acid (EDTA), nitrilotriacetic acid (NTA), and hydroxyethylethylenediaminetriacetic acid (HEDTA), etc. may be employed in the plating bath of the present invention, the preferred complexing agent is tartaric acid or a tartrate, such as potassium sodium tartrate ($KNaC_4H_4O_6$). In certain embodiments, other suitable complexing agents contain a carboxyl or an amine functional group. The bath also contains a source of Group IIIA species (indium in this example) and a Group VIA material source (selenium in this example). The tartrate in the solution chemistry is believed to form a complex with the $In^{3+}$ ions in the aqueous solution according to equation (2) below. One unique feature of the tartaric acid is the fact that it possesses two $pK_a$ values: $pK_{a1}$=3.02 and $pK_{a2}$=4.54. Therefore, In was found to form the above complex with tartrate that protects $In^{3+}$ from precipitation as $In(OH)_3$ in a neutral or basic aqueous solution. Selenium, on the other hand, is believed not to form a complex with the tartrate salts but it is already soluble in basic baths where it is in the form of $SeO_3^{2-}$.

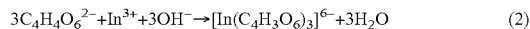

$$3C_4H_4O_6^{2-}+In^{3+}+3OH^-\rightarrow[In(C_4H_3O_6)_3]^{6-}+3H_2O \quad (2)$$

As can be appreciated from the above discussion the unique composition and the neutral to alkali (or basic) pH values (pH values larger than or equal to about 7) of the plating chemistries of the present invention have the ability to keep both group IIIA and Group VIA species in solution without precipitation. Group IIIA species are believed to be kept in solution through complexing with the complexing agent, and the Group VIA species are believed to be kept in solution through chemical dissolution at the high pH values. In addition to keeping these two species in solution, the unique chemistry of the present invention also brings their deposition potentials close to each other so that co-electroplating of both species may be performed in such high pH solutions.

Referring back to the example of In—Se electroplating, in a neutral or basic aqueous solution, $SeO_3^{2-}$ may be reduced at the cathode surface according to the following reaction (3):

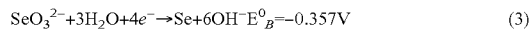

$$SeO_3^{2-}+3H_2O+4e^-\rightarrow Se+6OH^-\quad E^0_B=-0.357V \quad (3)$$

(A. J. Bard, R. Parsons, and J. Jordan., *Standard Potentials in Aqueous Solutions*, CRC Press, 1985, p 114)

This standard potential is almost the same as the one for In, $E^0_{In(III)/In}$=−0.34 V, in an alkaline aqueous solution. By contrast, the same $SeO_3^{2-}$ reduction in an acidic solution requires a standard potential of about 0.885 V according to the Bard et al. reference cited above. This may suggest that the co-electrodeposition method of the present invention in neutral and alkaline solutions can be better controlled and be more repeatable compared to the acidic aqueous solutions of the prior art approaches, because the reduction potentials of the In and Se species are closer to each other in the solutions of the present invention. According to our cathodic polarization and cyclic voltammetry measurements made in the basic or alkaline solutions of the present invention demonstrated that the unique solution chemistry moved the reduction potentials of both $In^{3+}$ and $SeO_3^{2-}$ to a more negative direction, but allowing the difference between $SeO_3^{2-}$ and $In^{3+}$ reduction potentials to be minimal. These measurements confirmed that Se could be successfully co-deposited with In to form In—Se films in a repeatable manner using the solution chemistries of the present invention. It should be noted that if the electrodeposition potentials of species are very different from each other, the co-electrodeposition process to deposit these species on a cathode surface becomes very sensitive, i.e. a small change in the process parameters causes a large variation in the deposited layer composition, uniformity and micro-structure.

EXAMPLE

To demonstrate the wide range of capabilities of the developed chemistry and technique, the electroplating conditions of the In—Se layers were widely varied using a factorial design with three factors and three levels as shown in Table 1. The three factors that were changed in the experiments were; i) the molar ratios of $(In^{3+}/SeO_3^{2-})$ in the solution which were set to 0.05/0.2, 0.1/0.05, and 0.05/0.1, ii) the pH values, which were adjusted to 10, 11.5 and 13, and, iii) the deposition current densities which were varied from 5 to 20 mA/cm². All the solutions used in this example contained about 0.7 M of potassium sodium tartrate ($KNaC_4H_4O_6$) as the complexing agent, and the solution pH was adjusted using NaOH. The films were electroplated on cathode surfaces comprising pure In with a constant plating charge of 0.6 C/cm². The composition of the plated In—Se films was measured using XRF and the surface morphologies were examined with SEM. The co-deposition efficiencies, $\eta_{In+Se}$, were estimated by measuring the total deposited molar amounts of In and Se (XRF measurement) and dividing this total value by the theoretical total molar amounts according to the Faraday's Law, $n=Q/[F(4x+3y)/(x+y)]$, where x and y are composition parameters of the formula of $In_ySe_x$, Q is the deposition charge and F is the Faraday's constant.

TABLE 1

| Test No. | $In^{3+}/SeO_3^{2-}$ Ratio (in solution) | pH | J (mA/cm²) | In—Se Composition (from XRF data) | $\eta_{In+Se}$ (%) |
|---|---|---|---|---|---|
| 1 | 0.05/0.1 | 11.5 | 10 | $In_2Se_3$ | 42 |
| 2 | 0.05/0.1 | 10 | 10 | $In_7Se_6$ | 63 |
| 3 | 0.1/0.05 | 13 | 10 | $In_9Se$ | 68 |
| 4 | 0.05/0.1 | 10 | 5 | $In_4Se_7$ | 44 |
| 5 | 0.05/0.1 | 13 | 5 | $In_7Se_2$ | 47 |
| 6 | 0.05/0.2 | 13 | 5 | $In_4Se_3$ | 56 |
| 7 | 0.05/0.2 | 10 | 5 | $In_4Se_5$ | 51 |
| 8 | 0.05/0.2 | 11.5 | 20 | $In_7Se_5$ | 64 |
| 9 | 0.05/0.1 | 13 | 20 | $In_5Se$ | 47 |
| 10 | 0.1/0.05 | 10 | 20 | $In_2Se$ | 23 |
| 11 | 0.1/0.05 | 11.5 | 5 | InSe | 41 |
| 12 | 0.05/0.2 | 13 | 10 | InSe | 51 |

As can be seen from the data of Table 1, tests #1, #4 and #7 resulted in a composition of the plated In—Se films which was close to the $In_2Se_3$ compound phase. Furthermore, it is also observed that lower molar ratios of $(In^{3+}/SeO_3^{2-})$ species in the plating solution tended to produce more Se-rich alloys or mixtures. Higher pH values, on the other hand, reduced the Se amount in the deposited layers. Higher plating current densities increased the amount of In in the In—Se films. These results demonstrate that the method and the high pH chemistry of the present invention have the capability to produce In—Se films with a wide range of compositions by simply adjusting the concentrations of ionic species in the electrolyte, and/or by varying the plating current density, and/or by varying the pH value. Through these variables a wide range of compositions of In—Se with In/Se ratio of less than 1, equal to 1, or more than 1 may be obtained.

As stated before the above experiments were carried out using In as the cathode during electroplating. To demonstrate the possible use of other cathodes with surfaces comprising Cu and/or Ga, experiments were repeated where In—Se films with various compositions were electroplated on structures to obtain various stacks including but not limited to the stacks of "substrate/Cu/In—Se", "substrate/Cu/Ga/In—Se", "substrate/Cu/In/In—Se", "substrate/Cu/Ga/Cu/In/In—Se", "substrate/Cu/Ga/Cu/In—Se", etc. Such precursor stacks may be heated up to temperatures of 400-600 C, preferably in presence of additional Se and/or S to form "substrate/CuIn(Se,S)₂" or "substrate/Cu(In,Ga)(Se,S)₂" solar cell absorber structures as described before.

Although the above examples were performed in the solutions containing potassium sodium tartrate, other tartrate salts and compounds such as tartaric acid and diethyl L-tartrate have been tested and were found to work well for this invention. Therefore, the related tartrate compounds and salts can be extended to their whole family including alkaline and alkaline earth metallic salts, ammonium salts of tartrates and organically modified tartrates such as alkyl or dialkyl tartrates.

Gallium may also be added into the composition of the electroplated film to obtain (In,Ga)—Se layers with compositions ranging from In—Se to Ga—Se. Although the invention is described mostly for Se containing film formation, Se in the bath may be replaced by another Group VIA material selected from the group of S and Te to obtain (In,Ga)—S or (In,Ga)—Te layers. By mixing Te, and/or Se, and/or S sources in the electrolyte in various compositions it is also possible to obtain layers with compositions that can be generally described as (In,Ga)—(Se,S,Te). In this case the Ga/(In+Ga), In/(In+Ga), Se/(S+Te), S/(Se+Te), and Te/(Se+S) ratios may be any value desired.

Group IIIA material source in the plating bath compositions of the present invention may comprise stock solutions prepared by dissolving In and Ga metals into their ionic forms as well as by dissolving soluble In and Ga salts, such as sulfates, chlorides, acetates, sulfamates, carbonates, nitrates, phosphates, oxides, perchlorates, and hydroxides. Selenium oxide, S oxide, Te oxide may provide the Group VIA material to the plating bath although other Group VIA compounds or elemental Group VIA materials may also be used as long as they dissolve in the electrolyte. In certain embodiments, the Group VIA material source may be other Group VIA compounds of Se, S, and Te such as acids of Se, S, and Te as well as oxides, chlorides, bromides, iodides, sulfates, nitrates, perchlorates and phosphates of Se, Te and S. The concentrations of the complexing agents can be adjusted according to the amounts of Group IIIA and Group VIA materials in the bath. The solution pH values may be adjusted on the basis of the concentrations of the Group IIIA and Group VIA species to get a clear solution with no solid or gel phase present. The preferred pH value is equal to or higher than the neutral value of 7. A more preferred pH value is between 8 and 14. Although water is the preferred solvent in the formulation of the plating baths of the present invention, it should be appreciated that organic solvents may also be added in the formulation, partially or wholly replacing the water. Such organic solvents include but are not limited to alcohols, acetonitrile, propylene carbonate, formamide, dimethyl sulfoxide, glycerin etc.

Although the DC voltage/current was utilized during the electrochemical codeposition processes in the present invention, it should be noted that pulsed or other variable voltage/current sources may also be used to obtain high plating efficiencies and high quality deposits. Also these different electrochemical methods may be contributed to control the Group IIIA/Group VIA molar ratio in the electroplated layers. The temperature of the electroplating baths may be in the range of 5-120° C. depending upon the nature of the solvent. The preferred bath temperature for water based formulation is in the range of 10-90° C.

The electroplating baths of the present invention may comprise additional ingredients. These include, but are not limited to, grain refiners, surfactants, wetting agents, dopants, other metallic or non-metallic elements etc. For example, organic additives such as surfactants, suppressors, levelers, accelerators etc. may be included in the formulation to refine its grain structure and surface roughness. Organic additives include but are not limited to polyalkylene glycol type polymers, propane sulfonic acids, coumarin, saccharin, furfural, acrylonitrile, magenta dye, glue, SPS, starch, dextrose, and the like.

Although the present invention is described with respect to certain preferred embodiments, modifications thereto will be apparent to those skilled in the art.

We claim:

1. An electrodeposition solution for deposition of a Group IIIA-Group VIA thin film on a conductive surface, the electrodeposition solution comprising:
   a solvent;
   a Group IIIA material source that provides a Group IIIA material in ionic form in the solvent and in an amount equal to or greater than 0.05 mol/liter, wherein the Group IIIA material source comprises both an In source and a Ga source;
   a Group VIA material source that dissolves in the solvent and provides a Group VIA material in ionic form; and
   a complexing agent that forms a complex ion of the Group IIIA material wherein such complex ion dissolves in the solvent;
   and wherein the pH of the solution is at least 7.

2. The solution of claim 1 wherein Group VIA material from the Group VIA material source does not substantially form a complex with the complexing agent.

3. The solution of claim 1 wherein the Group VIA material source is capable of dissolving in the solvent under alkaline conditions in the absence of the complexing agent.

4. The solution of claim 1 wherein the pH value of the solution is in the range of 8-14.

5. The solution of claim 1 wherein the Group VIA material source comprises Se.

6. The solution of claim 5, wherein the Group IIIA material source comprises a dissolved Ga metal and a dissolved Ga salt, and wherein the Ga salt is selected from the group consisting of Ga-chloride, Ga-sulfate, Ga-sulfamate, Ga-acetate, Ga-carbonate, Ga-nitrate, Ga-perchlorate, Ga-phosphate, Ga-oxide, and Ga-hydroxide.

7. The solution of claim 5, wherein the Group IIIA material source comprises both dissolved In and Ga metals, and dissolved In and Ga salts, wherein the In salts are selected from the group consisting of In-chloride, In-sulfate, In-sulfamate, In-acetate, In-carbonate, In-nitrate, In-phosphate, In-oxide, In-perchlorate, and In-hydroxide, and wherein the Ga salts are selected from the group consisting of Ga-chloride, Ga-sulfate, Ga-sulfamate, Ga-acetate, Ga-carbonate, Ga-nitrate, Ga-perchlorate, Ga-phosphate, Ga-oxide, and Ga-hydroxide.

8. The solution of claim 1, wherein the Group VIA material source comprises at least one of the species of (i) at least one of dissolved elemental Se, Te and S, (ii) at least one of acids of Se, Te and S, and (iii) at least one of dissolved Se, Te and S compounds, wherein the Se, Te and S compounds are selected from the group consisting of oxides, chlorides, bromides, iodides, sulfates, nitrates, perchlorates and phosphates of Se, Te and S.

9. The solution of claim 1 wherein the Group VIA material source comprises dissolved elemental Se, an acid of Se, and a dissolved Se compound, wherein the Se compound is selected from the group consisting of oxides, chlorides, bromides, iodides, sulfates, nitrates, perchlorates and phosphates of Se.

10. The solution of claim 9 wherein the complexing agent has at least one of a carboxyl functional group and an amine functional group.

11. The solution of claim 10 wherein the complexing agent comprises at least one of the species of (i) an acid and (ii) an alkali metal salt of the acid, and wherein the acid comprises one of tartaric acid, citric acid, acetic acid, malonic acid, malic acid, succinic acid, ethylenediamine tetraacetic acid (EDTA), nitrilotriacetic acid (NTA), and hydroxyethylethylenediaminetriacetic acid (HEDTA).

12. The solution of claim 11 wherein the complexing agent is an alkali metal salt of tartaric acid including one of potassium sodium tartrate, potassium tartrate, sodium tartrate, ammonium tartrate, tetraalkyl ammonium tartrate, lithium tartrate, alkyl tartrate and dialkyl tartrate.

13. The solution of claim 12 further comprising an organic additive.

14. The solution of claim 1 wherein the complexing agent has at least one of a carboxyl functional group and an amine functional group.

15. The solution of claim 14 wherein the complexing agent comprises at least one of the species of (i) an acid and (ii) an alkali metal salt of the acid, and wherein the acid comprises one of tartaric acid, citric acid, acetic acid, malonic acid, malic acid, succinic acid, ethylenediamine tetraacetic acid (EDTA), nitrilotriacetic acid (NTA), and hydroxyethylethylenediaminetriacetic acid (HEDTA).

16. The solution of claim 15 wherein the complexing agent is an alkali metal salt of tartaric acid including one of potassium sodium tartrate, potassium tartrate, sodium tartrate, ammonium tartrate, tetraalkyl ammonium tartrate, lithium tartrate, alkyl tartrate and dialkyl tartrate.

17. The solution of claim 16 wherein the solvent is water.

18. The solution of claim 1 wherein the solvent is water.

19. The solution of claim 1 when Group IIIA material is Ga.

20. The solution of claim 1 when Group IIIA material is In.

* * * * *